(12) United States Patent
Knecht et al.

(10) Patent No.: US 7,983,624 B2
(45) Date of Patent: *Jul. 19, 2011

(54) RF FRONT-END MODULE FOR PICOCELL AND MICROCELL BASE STATION TRANSCEIVERS

(75) Inventors: Thomas A. Knecht, Dundee, IL (US); Andrew J. Fox, Chippenham (GB)

(73) Assignee: CTS Corporation, Elkhart, IN (US)

( * ) Notice: Subject to any disclaimer, the term of this patent is extended or adjusted under 35 U.S.C. 154(b) by 1087 days.

This patent is subject to a terminal disclaimer.

(21) Appl. No.: 11/452,800

(22) Filed: Jun. 14, 2006

(65) Prior Publication Data

US 2006/0286959 A1 Dec. 21, 2006

Related U.S. Application Data

(60) Provisional application No. 60/691,742, filed on Jun. 17, 2005, provisional application No. 60/711,566, filed on Aug. 26, 2005, provisional application No. 60/790,250, filed on Apr. 7, 2006.

(51) Int. Cl.
*H04B 1/38* (2006.01)
(52) U.S. Cl. .......... 455/73; 455/78; 455/550.1; 455/561
(58) Field of Classification Search .............. 455/67.11, 455/73, 78, 115.1, 226.1, 349, 550.1, 561, 455/575.1
See application file for complete search history.

(56) References Cited

U.S. PATENT DOCUMENTS

| 5,404,584 | A | * | 4/1995 | Bobbitt et al. | 455/115.2 |
| 5,596,487 | A | * | 1/1997 | Castaneda et al. | 361/814 |
| 5,838,551 | A | | 11/1998 | Chan | |
| 6,534,726 | B1 | * | 3/2003 | Okada et al. | 174/263 |
| 2003/0100287 | A1 | * | 5/2003 | Kordjani et al. | 455/349 |
| 2003/0143971 | A1 | | 7/2003 | Hongo et al. | |

OTHER PUBLICATIONS

Kelly, Derek, PCT International Search Report mailed Jul. 5, 2007 re: International Application No. PCT/US2006/023655 filed Jun. 16, 2006.
Kelly, Derek, PCT Written Opinion of the International Searching Authority mailed Jul. 5, 2007 re: International Application No. PCT/US2006/023655 filed Jun. 16, 2006.

* cited by examiner

*Primary Examiner* — Tuan H Nguyen
(74) *Attorney, Agent, or Firm* — Daniel J. Deneufbourg (57) ABSTRACT

An RF module adapted for direct surface mounting to the top surface of the front end of the motherboard of a picocell. The module comprises a printed circuit board having a plurality of direct surface mounted electrical components defining respective signal transmit and receive sections for RF signals. The signal transmit section is defined by at least a transmit bandpass filter, a power amplifier, an isolator, a coupler, and a duplexer. The signal receive section is defined by at least the duplexer, a receive low pass filter, a low-noise amplifier, and a receive bandpass filter. A lid covers selected ones of the electrical components except for at least the power amplifier. A plurality of through-holes defined in the printed circuit board below the amplifier allow for the dissipation of heat created by the amplifier. At least one aperture in the board is adapted to accept a screw or the like for securing the module to the motherboard of the picocell.

9 Claims, 7 Drawing Sheets

RF FRONT-END MODULE FOR PICOCELL AND MICROCELL BASE STATION TRANSCEIVERS

CROSS-REFERENCE TO RELATED APPLICATIONS

This application claims the benefit of the filing dates and disclosures of U.S. Provisional Application Ser. No. 60/691,742, filed on Jun. 17, 2005; U.S. Provisional Application Ser. No. 60/711,566, filed on Aug. 26, 2005; and U.S. Provisional Application Ser. No. 60/790,250, filed on Apr. 7, 2006 which are explicitly incorporated herein by reference as are all references cited therein.

FIELD OF THE INVENTION

The invention relates to a module and, more particularly, to a radio frequency module adapted for use on the front end of a picocellular or microcellular communication base station.

BACKGROUND OF THE INVENTION

There are currently three types of cellular communication base stations or systems in use today for the transmission and reception of W-CDMA and UMTS based cellular communication signals, i.e., macrocells, microcells and picocells. Macrocells, which today sit atop cellular towers, operate at approximately 1,000 watts. The coverage of macrocells is in miles. Microcells, which are smaller in size than macrocells, are adapted to sit atop telephone poles, for example, and the coverage is in blocks. Microcells operate at approximately 20 watts. A smaller yet microcell requires about 5 watts of power to operate. Picocells are base stations approximately 8"×18" in size, are adapted for deployment inside buildings such as shopping malls, office buildings or the like, and output about 0.25 watts of power. The coverage of a picocell is about 50 yards.

All of the picocells and microcells in use today include a "motherboard" upon which various electrical components have been individually mounted by the customer. A front-end portion of the motherboard (i.e., the RF transceiver section thereof located roughly between the picocell antenna and mixers thereof) is currently referred to in the art as the "node B local area front end," i.e., a portion of the picocell or microcell on which all the radio frequency control electrical components such as, for example, the filters, amplifiers, couplers, inductors and the like have been individually mounted and interconnected.

While the configuration and structure of the current motherboards has proven satisfactory for most applications, certain disadvantages associated with the current front-end RF configuration thereof include performance, the costs associated with a customer's placement of individual RF components onto the motherboard during assembly, and the space which such RF components occupy on such motherboards.

There thus remains the need for increased RF component performance and a reduction in both the cost of these motherboards and the space occupied by the RF components on such motherboards. The present invention provides a compact front-end RF component module which addresses and solves the above-identified needs.

SUMMARY OF THE INVENTION

The present invention relates to a module adapted for use on the front end of a picocell or microcell base station including a printed circuit board having a plurality of electrical components mounted directly thereto and adapted to allow for the transmission and reception of cellular signals between the antenna of the picocell or microcell on one end and the respective input and output pads on the motherboard of the picocell or microcell at the other end.

In one embodiment, the module comprises a plurality of electronic components including a signal transmit section or path which includes at least a transmit bandpass filter, a power amplifier, an isolator, a coupler, and a duplexer; and a signal receive section or path which includes at least the duplexer, a receive low pass filter, an optional attenuator pad, a low noise amplifier, and a receive bandpass filter.

The module further comprises a printed circuit board upon which the various electrical components are direct surface mounted. The printed circuit board in turn is adapted for direct surface mounting to the front end of the motherboard of a picocell. A lid is adapted to cover selected ones of the electrical components mounted to the printed circuit board. The duplexer, receive bandpass filter, and the low noise amplifier are all preferably located under the lid, while the power amplifier and the transmit bandpass filter are preferably located outside the lid. A plurality of through-holes or vias located below the amplifier are adapted to define a sink for heat created by the power amplifier.

An aperture in the board is adapted to accept a screw or the like for securing the module to a customer's motherboard.

Other advantages and features of the present invention will be more readily apparent from the following detailed description of the preferred embodiment of the invention, the accompanying drawings, and the appended claims.

BRIEF DESCRIPTION OF THE DRAWINGS

These and other features of the invention can best be understood by the following description of the accompanying FIGURES as follows.

DETAILED DESCRIPTION OF THE PREFERRED EMBODIMENT

While this invention is susceptible to embodiments in many different forms, this specification and the accompanying FIGURES disclose only one preferred embodiment as an example of the present invention which is adapted for use in a picocell. The invention is not intended, however, to be limited to the embodiment so described and extends, for example, to microcells as well.

In selected ones of the FIGURES, a single block or cell may indicate several individual components and/or circuits that collectively perform a single function. Likewise, a single line may represent several individual signals or energy transmission paths for performing a particular operation.

Figure 1:
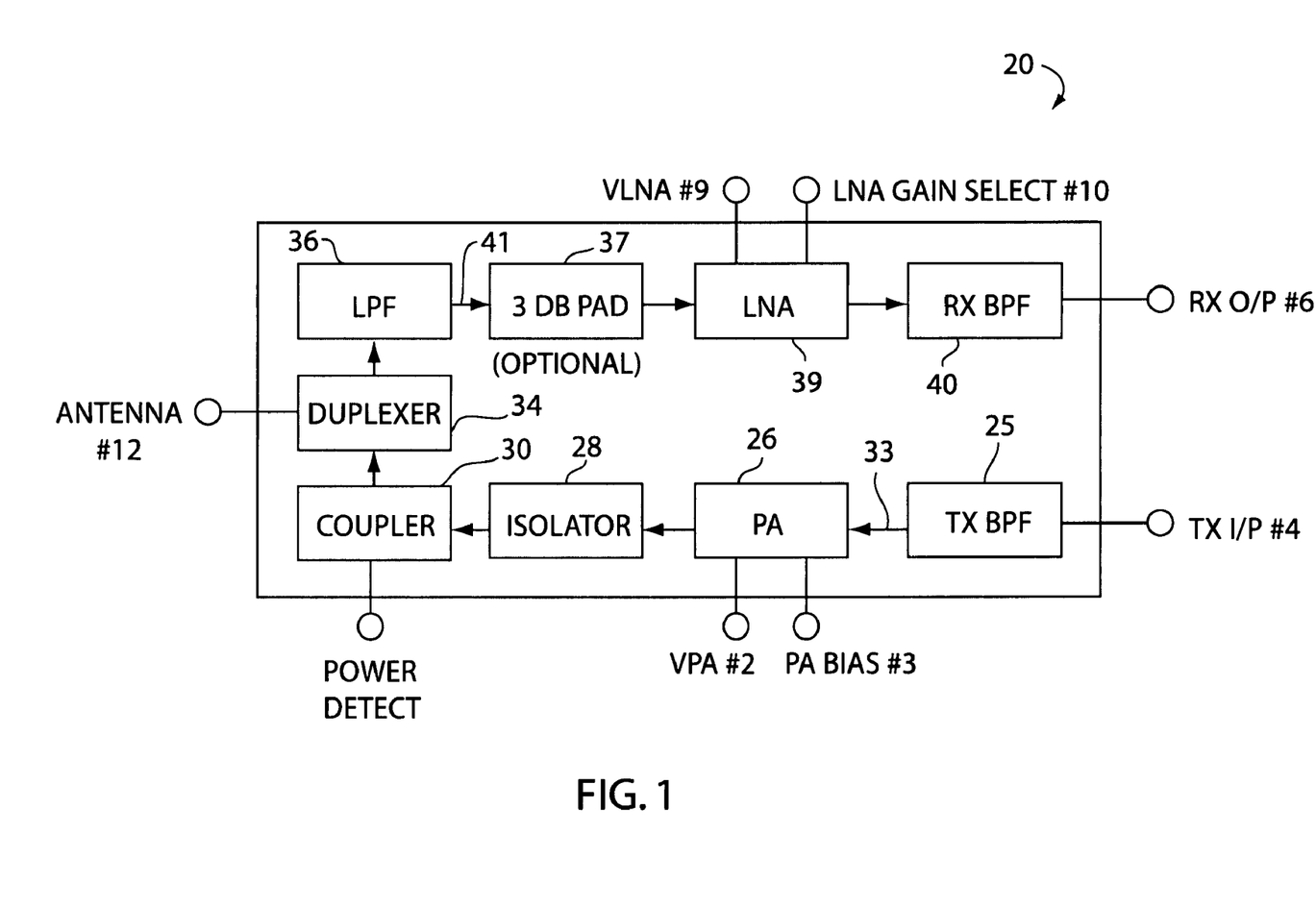
FIG. 1 is a simplified block diagram depicting the flow of cellular signals being transmitted and received through the various RF components defining the front-end module of the present invention.

FIG. 1 is a simplified block diagram of the RF (radio frequency) front-end module, generally designated 20, constructed in accordance with the present invention and adapted for use in connection with either a picocell or microcell.

As described in more detail below, the module 20 utilizes distributed filtering with three filters: a duplexer, a receive bandpass filter, and a transmit bandpass filter. The module 20 also includes a power amplifier, a low-noise amplifier and other necessary RF components. In the transmit path, module 20 is adapted to deliver 24 dBm WCDMA power at the antenna port, while achieving a typical ACLR (Adjacent Channel Power Leakage Ratio) of −50 dBc with a PAR (peak to average ratio) of 8 dB. Module 20 is particularly adapted for the 3G Wideband CDMA market, specifically UMTS (Universal Mobile Telecommunications Service).

Module 20 is adapted to replace all of the RF components that would be typically individually mounted and used in a UMTS Node B local area front end. Module 20 is compliant with TS25.104 R6 standards and allows customers to select different values for receiver sensitivity, selectivity, and output power. Moreover, module 20 is RoHS compliant and lead-free. Some of the features of the module 20 as described in more detail below include a scalable power amplifier capable of delivering 24 dBm at the antenna port; distributed filters offering excellent isolation and harmonic suppression; and a low noise amplifier with a bypass mode to increase receiver linearity.

Referring now in particular to FIG. 1, it is understood that module 20 is defined by a plurality of RF electrical components and pins defining respective RF signal transmit and receive sections or paths. Initially, and as shown therein, the lower RF transmit section or path of module 20 includes a first Tx (transmit) signal input pin #4 adapted to be coupled to a corresponding Tx (transmit) signal pad on the motherboard (not shown) of a picocell or microcell. Pin #4 in turn is coupled to a Tx BPF (transmit bandpass filter) 25 which, in turn, is coupled to a PA (power amplifier) 26 which, in turn, is coupled to an isolator 28 which, as known in the art, is an electrical device adapted to allow the passage of the signal from the power amplifier 26 with very low loss but with high loss in the opposite direction from the coupler 30 so as to isolate the coupler 30 from the amplifier 26 and provide protection from any variations in loading conditions or what is referred to in the art as "mis-matching". Thus, for example, where the load VSWR (voltage standing wave ratio) is 10:1, the isolator 28 would have 18 dB isolation, thus improving the VSWR to 1.2:1 with an insertion loss of 0.6 dB.

The isolator 28 is in turn coupled to a coupler 30 which is adapted to allow a portion of the transmit signal passing therethrough to be split and passed to a power detect pin #13 as described in more detail below.

Coupler 30 in turn is coupled to a duplexer 34, of the type made and sold by CTS Corporation of Elkhart, Ind. Duplexer 34 is adapted to send the transmit signal, generally designated by the arrows 33, which has been passed successively in a counter-clockwise direction from Tx input pin #4 through Tx bandpass filter 25, power amplifier 26, isolator 28, coupler 30, and duplexer 34, through the output of duplexer 34 and antenna pin #12.

VPA (power amplifier supply voltage) pin #2 and PA bias pin #3 are both coupled to power amplifier 26. Antenna pin #12 as described below in more detail extends between the top and bottom surfaces of the module 20 and is adapted to be direct surface mounted into coupling relationship with the antenna pad (not shown) of a picocell or microcell so as to allow for the transmission of the signals which have passed through the RF signal transmission section of module 20.

The top receive section or path of the signals being received (i.e., Rx signals) from the picocell or microcell antenna (not shown) and transmitted through the module 20 will now be described also with reference to FIG. 1 which shows the Rx signal being transmitted and passed in a left to right, clockwise direction from the picocell or microcell antenna (not shown) through the module antenna pin #12 and then initially through duplexer 34.

Duplexer 34 is, of course, adapted and structured as known in the art to allow the passage of the Rx signal clockwise in the direction of the Rx LPF (low pass) filter 36 rather than the coupler 30. From the low pass filter 36, the Rx signal, generally designated by the arrows 41, may optionally be passed through a 3 dB attenuator pad 37 (comprised of resistors R5, R6, and R7 as described in more detail below), and then through a LNA (low noise amplifier) 39. Low noise amplifier 39 is coupled to VLNA (LNA supply voltage) pin #9 and LNA gain select pin #10.

From the low-noise amplifier 39, the Rx signal then travels through an Rx BPF (receive bandpass ceramic filter) 40 of the type made and sold by CTS Corporation of Elkhart, Ind. From the Rx bandpass filter 40, Rx signal 41 passes into Rx output signal pin #6 which, in turn, is adapted to extend between the top and bottom surfaces of the module 20 as described in more detail below for direct surface coupling to the corresponding Rx output signal pad (not shown) on the motherboard of the picocell or microcell.

In accordance with the present invention, attenuator pad 37 is optional and may be used to de-sensitize the receive chain and make the receiver more linear, i.e., to decompress the receive chain when the Node B is deployed in an environment, for example, where other devices are operated in close proximity to the picocell. Where more sensitivity is desired at the expense of linearity, pad 37 may have a different value. Optionally, of course, the pad 37 can be omitted altogether. All 3 GPP specifications are met even with the 3 dB-pad 37 in place.

FIGS. 2-7 depict one embodiment of a module 20 adapted and structured to be direct surface mounted to the front end of a picocell.

Figure 5:
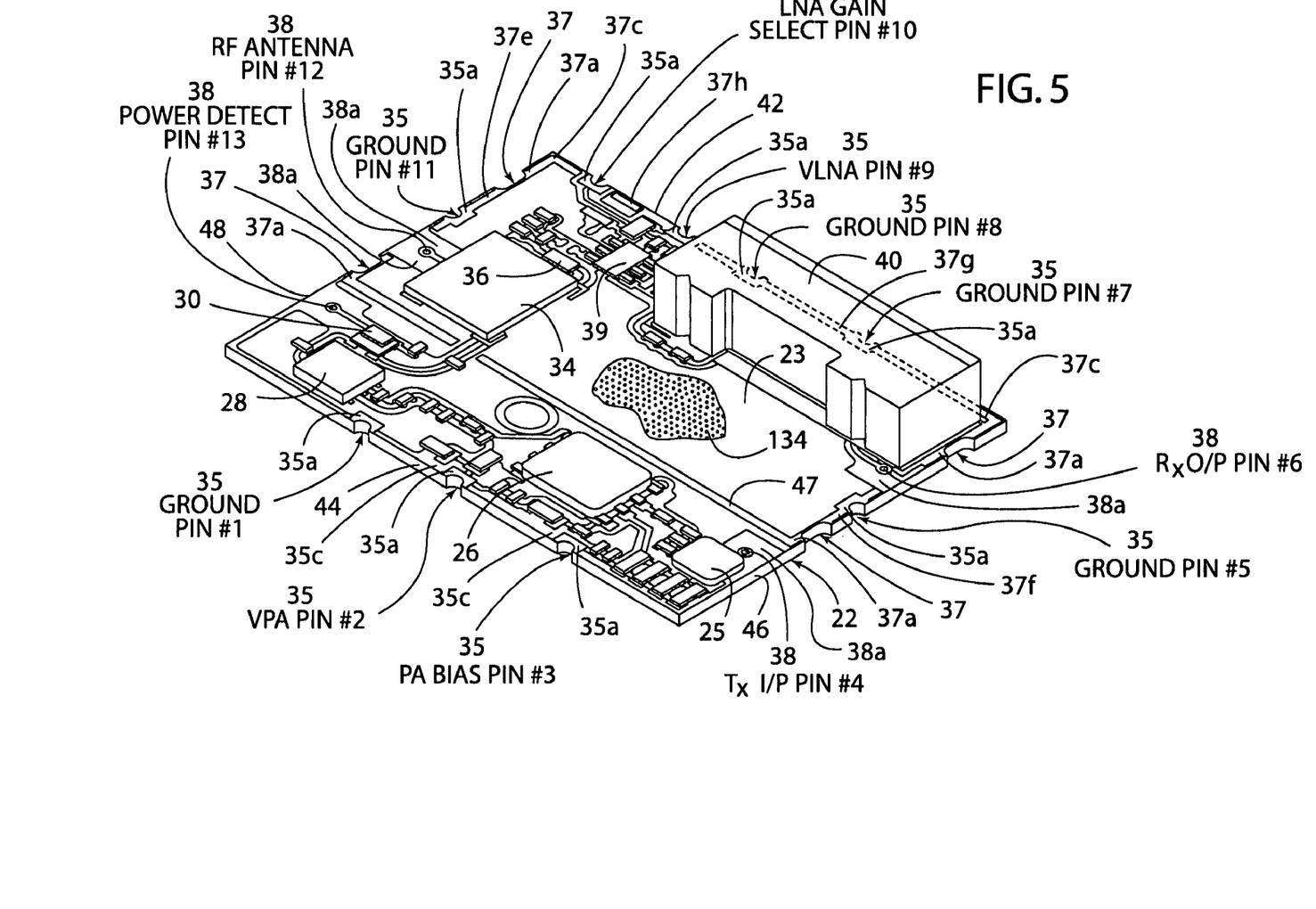
FIG. 5 is an enlarged perspective view of the front-end module with the lid removed therefrom.
Figure 7:
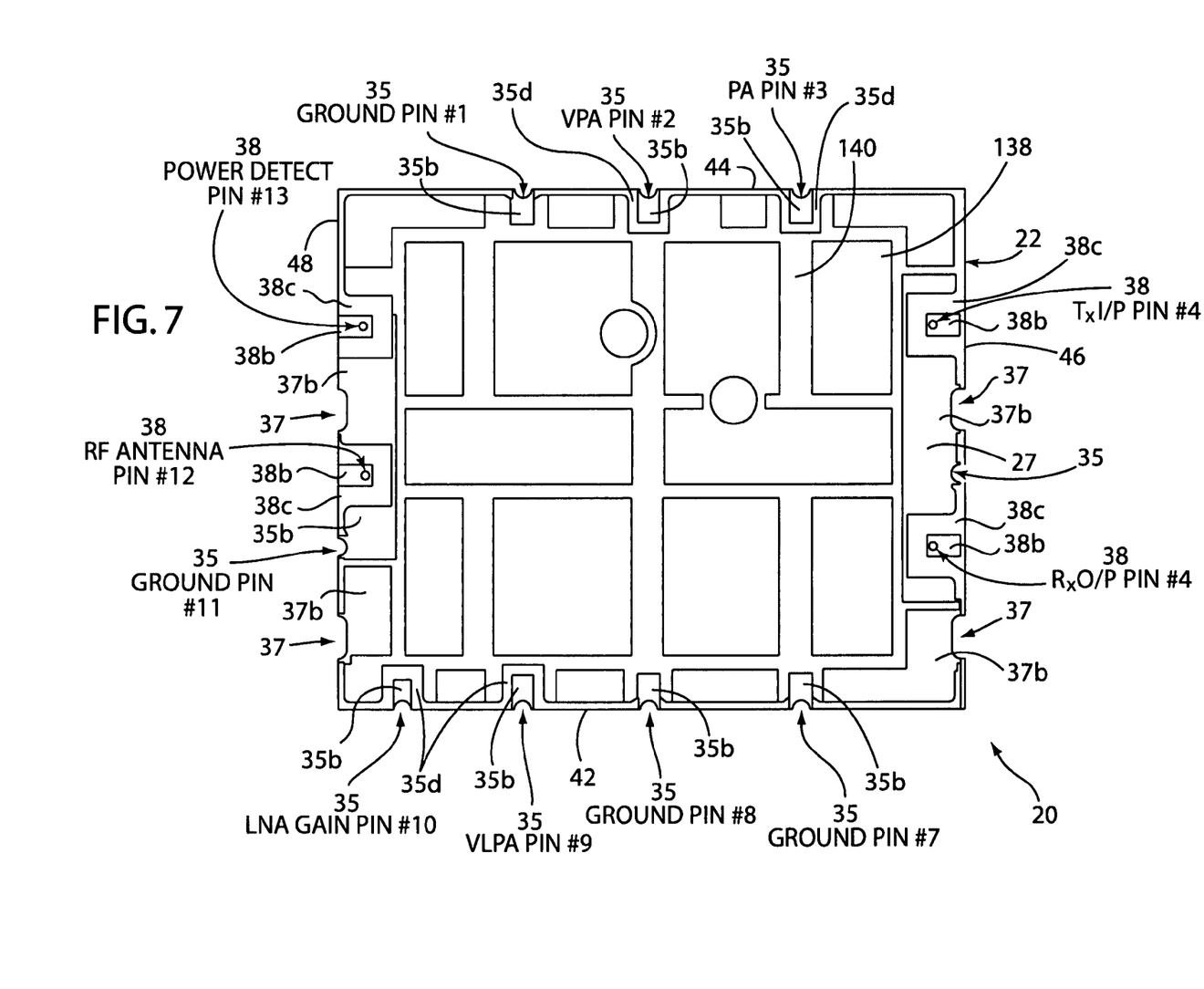
FIG. 7 is an enlarged bottom plan view of the front-end module of the present invention.

By way of background, it is understood that module 20 of the present invention as depicted in FIGS. 5 and 7 measures about 25.0 mm in width, 30.5 mm in length, and 6.75 mm max. in height (with the lid secured thereon), and is adapted to be mounted to the motherboard of a picocell measuring about 8 inches by 18 inches which, as described above, is adapted for use as a cellular signal transfer base station inside a building such as a shopping mall or office complex. The typical power output of a picocell is approximately 250 mW. The frequency of the Rx signal received by a picocell is between about 1920-1980 MHz, while the frequency of the Tx signal is between about 2110-2170 MHz. The power amplifier supply voltage is between about 4-9 volts and typically about 8 volts, while the low noise amplifier supply voltage is between about 2.5-5.5 volts and typically about 5.0 volts.

In accordance with the present invention, module 20 initially comprises a printed circuit board or substrate 22 which, in the embodiment shown, is preferably made of four layers of GETEK® or the like dielectric material and is about 1 mm (i.e., 0.040 inches) in thickness. Predetermined regions of the substrate 22 are covered with copper or the like material and solder mask material, both of which have been applied thereto and/or selectively removed therefrom as is known in the art to create the particular copper, dielectric, and solder mask regions shown in FIGS. 5, 7 and 9. The metallization system is preferably ENIG, electroless nickel/immersion gold over copper.

A lid 45, which is adapted to cover about two-thirds of the area of the printed circuit board 22 as described in more detail below, is preferably brass with a Cu/Ni/Sn (copper/nickel/tin) plated material for ROHS compliance purposes. The area of the top of the board 22 located above copper line or strip 47 (FIG. 2) on board 22 defines the portion of board 22 adapted to be covered by the lid 45 as described in more detail below. The lid 45 is adapted to act both as a dust cover and a Faraday shield.

Generally rectangularly-shaped substrate 22 has a top or upper surface 23 (FIG. 5), a bottom or lower surface 27 (FIG. 7) and an outer peripheral circumferential edge defining upper and lower faces or edges 42 and 44 and side faces or edges 46 and 48 (FIGS. 5 and 7). Although not described in any detail, it is understood that, in a preferred embodiment, substrate 22 will be comprised of a plurality of stacked laminate layers of suitable dielectric material sandwiched between respective layers of conductive material as is known in the art such as, for example, a bottom RF ground plane layer, an RF intermediate signal layer, a top RF ground layer, and a topmost DC layer plus ground layer.

Castellations 35 and 37 are defined and located about the outer peripheral edge of board 22. Castellations 35 define the various ground and DC input/output pins of the module 20, while slots or castellations 37 are adapted to receive the tabs of the lid 45 as described in more detail below.

Castellations 35 are defined by metallized semicircular grooves which have been carved out of the respective edges 42, 44, 46 and 48 and extend between the respective top and bottom surfaces 23 and 27 of the substrate 22. In the embodiment shown, the castellations 35 are defined by plated through-holes which have been cut in half during manufacturing of the substrates from an array. Castellations 35 extend along the length of the respective edges of substrate 22 in spaced-apart and parallel relationship. In the embodiment as shown in FIGS. 5 and 7, the top edge 42 defines four spaced-apart castellations 35, the lower edge 44 defines three spaced-apart castellations 35, and the side edges 46 and 48 each define one castellation 35.

Each of the side edges 46 and 48 defines a pair of spaced-apart metallized castellations 37 which are diametrically opposed from one another. Each castellation 37 is defined by an extended or elongated oval-shaped groove which has been carved out of each of the respective substrate side edges 46 and 48 respectively. All of the castellations are located above copper line or strip 47.

The outer surface of each of the respective castellations 35 and 37 is coated as by electroplating or the like, with a layer of copper or the like conductive material which is initially applied to all of the surfaces of the substrate 22 during the manufacturing of the substrate 22 as is known in the art and then removed from selected portions of the surfaces to define the copper coated castellations 35 and 37. Castellations 35 and 37 and, more specifically, the copper thereon creates an electrical path between top surface 23 and bottom surface 27 of substrate 22. Castellations 37 can be connected to ground. The copper extends around both the top and bottom edges of each of the castellations 35 so as to define a generally arcuate strip or pad of copper or the like conductive material 35a on the top surface 23 of substrate 22 and surrounding the top edge of each of the respective castellations 35 (FIG. 5); and a plurality of generally rectangularly-shaped strips 35b extending inwardly from the bottom edge of each of the castellations 35 so as to define a plurality of pads formed on the bottom surface 27 of substrate 22 (FIG. 7) which allow the module 20 to be directly surface mounted by reflow soldering or the like, to corresponding pads located on the surface of the motherboard of the picocell (not shown).

In accordance with the present invention, the pads 35a and 35b of castellations 35 defining pin #s 2, 3, 9, and 10 as described in more detail below are not ground pins and thus are surrounded by regions 35c (FIG. 5) and 35d (FIG. 7) respectively of the top and bottom surfaces of the substrate 22 which are not covered with copper or the like material, i.e., regions of substrate dielectric material.

Each of the castellations 37 additionally defines strips or pads 37a (FIG. 5) and 37b (FIG. 7) of copper or the like conductive material that are formed on the top and bottom surfaces 23 and 27 respectively of substrate 22 and surround the top and bottom peripheral edges respectively of each of the respective castellations 37.

Each of the top castellations 37 additionally defines a corner strip 37c (FIG. 5) of copper or the like conductive material extending from the respective copper strips 37a surrounding respective upper castellations 37 and extending around the top corners of the board 22, while the strips 37a of the respective lower castellations 37 are connected to the ends of elongate copper strip or line 47 extending therebetween in a relationship spaced from and parallel to upper and lower board edges 42 and 44 respectively. Corner strip 37c on the left side of substrate 22 is spaced from the strip 35a of castellation 35 defining the LNA gain select pin #10.

A strip 37e (FIG. 5) of copper or the like material extends between and electrically connects the castellation 35 extending along the left side substrate edge 48 to the upper castellation 37 also extending along the left side substrate edge 48.

A strip 37f (FIG. 5) of copper or the like material extends along the right side substrate edge 46 between, and in electrical connection with, the castellation 35 defining ground pin #5 and the lower castellation 37. Still further, it is understood that an elongate strip 37g (FIG. 5) of copper or the like conductive material extends along the top substrate edge 42 between the right side corner strip 37c at one end and the castellation 35 defining the VLNA pin #9 as described in more detail below at the other end. Strip 37g is electrically connected to the corner strip 37c, the castellation 37 on the right side substrate edge 46 and the two castellations 35 extending along the top peripheral substrate edge 42 and defining ground pin #s 7 and 8 (FIG. 7) as described in more detail below.

The left side end of strip 37g, however, is spaced from the castellation 35 defining VLNA pin #9 and is thus not electrically connected thereto. Another short strip 37h (FIG. 5) of copper or the like material extends along the top peripheral substrate edge 42 between and in spaced, non-contacting, relationship with the castellation 35 defining VLNA pin #9 and the castellation 35 defining LNA gain select pin #10 also extending along the top peripheral substrate edge 42.

Each of the right and left side edges 46 and 48 additionally define and include a pair of spaced-apart conductive vias 38 which define the respective RF component input/output pin #s 4, 6, 12 and 13 of the module 20 as also described in more detail below. Vias 38 extend through the substrate 22 between the top and bottom surfaces 23 and 27 thereof and, as known in the art, define an interior cylindrical surface which has been plated with copper or the like conductive material. In accordance with the present invention, the use of vias 38 which are spaced from the respective substrate side edges 46 and 48 instead of castellations 35 defined in respective substrate edges 46 and 48 insures a constant 50-ohm characteristic impedance. The top openings of each of the vias 38 are surrounded by regions 38*a* (FIG. 5) of dielectric substrate material, i.e., areas of the substrate 22 from which the conductive copper material has been removed as by an etching, lasing or the like process known in the art.

The lower openings of each of the vias 38 on the lower surface 27 of substrate 22 are surrounded by generally rectangularly-shaped pads 38*b* (FIG. 7) of copper or the like conductive material. The pads 38*b* in turn are surrounded by regions 38*c* of the lower surface 27 of substrate 22 from which the copper material has been removed as known in the art during the manufacture of substrate 22.

Thus, and as shown in FIG. 5, the castellations 35, castellations 37 and vias 38 are all positioned along each of the respective substrate side edges 46 and 48 in a spaced-apart relationship wherein one each of the castellations 35 and vias 38 is located between the pair of castellations 37 all above the copper strip 47 and wherein the lower via 38 is located below the copper strip 47. The lower vias 38 on respective side edges 46 and 48 are diametrically opposed.

Figures 2, 3, 4:
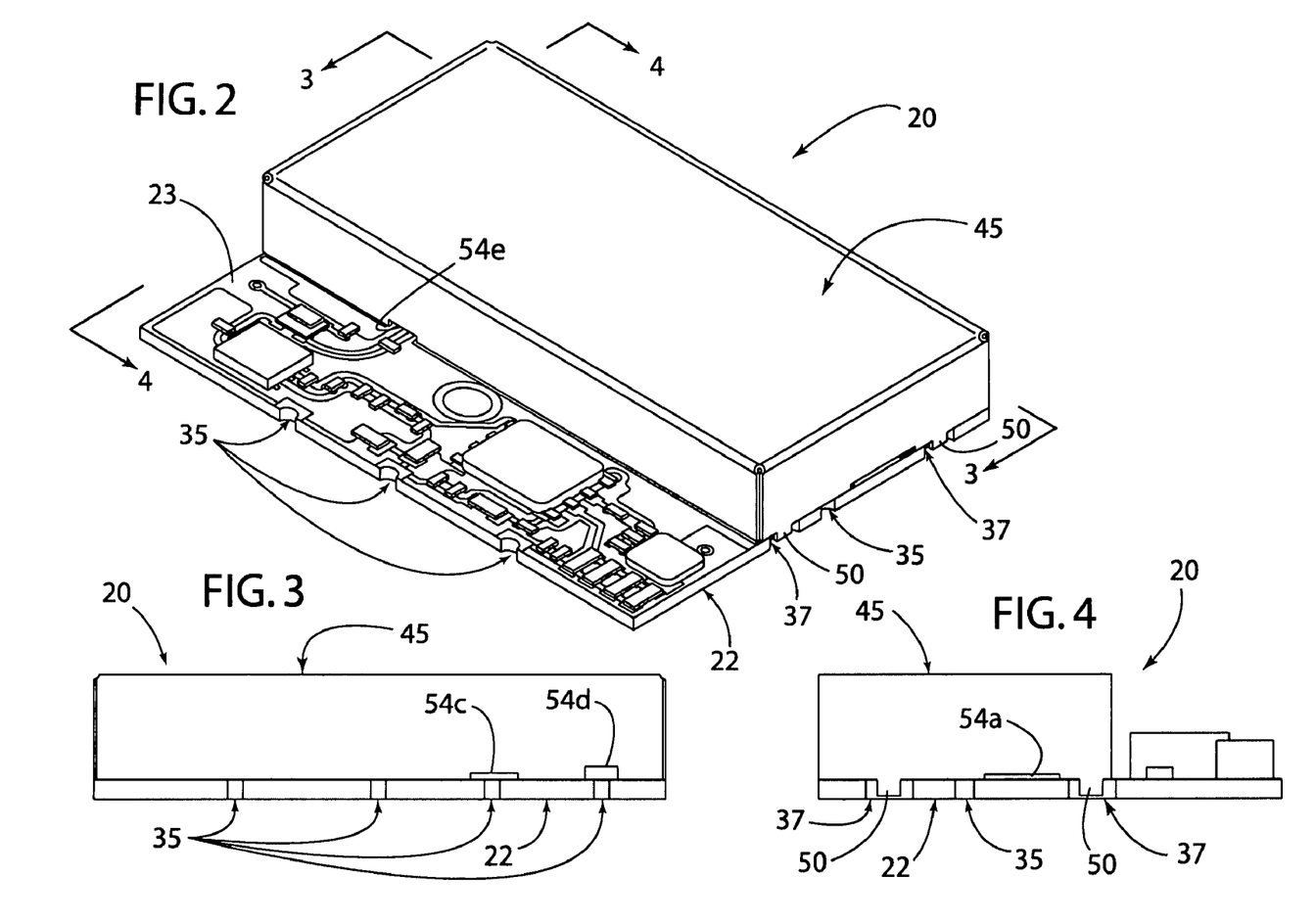
FIG. 2 is an enlarged perspective view of a front-end module in accordance with the present invention.
FIG. 3 is a rear elevational view of the front-end module taken along the line 3-3 in FIG. 2.
FIG. 4 is a side elevational view of the front-end module taken along the line 4-4 in FIG. 2.

As shown in FIGS. 2 and 5, power amplifier 26 is preferably located in an area of the printed circuit board 22 below the copper strip 47, i.e., an area not intended to be covered by the lid 45, so as to allow for the dissipation of heat created by the amplifier 26 and also to reduce the transfer of heat created by the amplifier 26 to any of the electrical components located under the lid 45.

Figure 9:
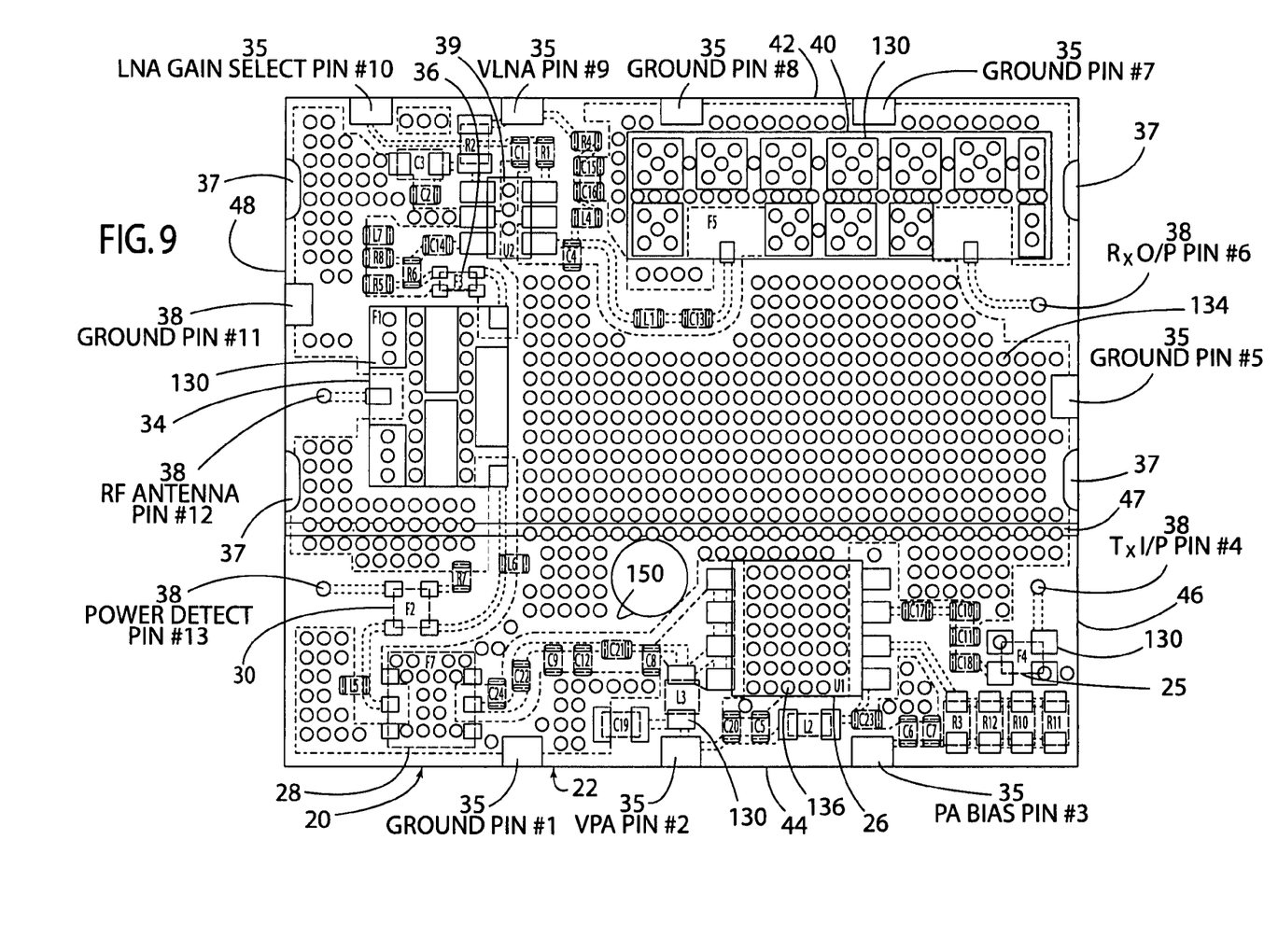
FIG. 9 is an enlarged simplified plan view of the top surface of the printed circuit board of the front-end module of the present invention.

As also shown in FIGS. 2, 5 and 9, duplexer 34, Rx low pass filter 36, Rx bandpass filter 40, and Rx low noise amplifier 39 are all mounted on an area of the top surface of the board 22 above the elongate copper strip 47 and thus intended to be covered by the lid 45.

More specifically, and as shown in FIGS. 5 and 9, Rx bandpass filter 40 is located in the upper right hand corner of the board 22 and extends generally longitudinally in a relationship adjacent and parallel to the top longitudinal edge 42 of board 22. Rx O/P pin #6 is located adjacent the side board edge 46 generally opposite the right end face of filter 40. Ground pin #s 7 and 8 are located along the top edge 42 in an orientation generally opposite the longitudinal top edge of filter 40. Rx bandpass filter 40 is adapted to work in conjunction with the duplexer 34 to provide in excess of 65 dB "transmit to receive" isolation. The other function of the filter 40 is to provide the "blocking" needed to be compliant with the TS25.104R6 standard blocking requirement that leads to a front end attenuation of 15 dB to 20 dB at 1.9 GHz and 2 GHz.

Tx bandpass SAW (surface acoustic wave) filter 25 is located and seated in the lower right-hand corner of the module 20. More specifically, SAW filter 25 extends generally longitudinally in a relationship parallel to and below and spaced from the copper strip 47 on board 22 and in a relationship spaced and adjacent to board edges 44 and 46. Tx input pin #4 is located directly above and spaced from the filter 25 between the filter 25 and the strip 47. The Tx bandpass filter 25, in conjunction with the duplexer 34, is adapted to attenuate transmit spurious and prevent Rx de-sensitization.

GND (ground) pin #1, VPA pin #2 and PA bias pin #3 (all defined by respective castellations 35) are respectively located along the lower longitudinal edge 44 of the board 22 in spaced-apart relationship from left to right.

Tx I/P (transmit input) pin #4, GND (ground) pin #5, and Rx O/P (receive output) pin #6 are respectively located along the right side elongate edge 46 of board 22 in a spaced-apart relationship from bottom to top. Tx I/P pin #4 is located below copper strip 47. The Rx O/P pin #6 and Tx I/P pin #4 are located above copper strip 47 and are defined by the respective vias 38 described above, while ground pin #5 is defined by one of the castellations 35. A castellation 37 is defined in edge 46 between strip 47 and castellation 35 defining pin #5. Another castellation 37 is defined in edge 46 between the via 38 defining the pin #6 and the top substrate edge 42.

GND (ground), GND (ground), VLNA (voltage low noise amplifier) and LNA gain select pin #s 7, 8, 9 and 10, respectively (FIGS. 5 and 7) are located and extend along the top longitudinal edge 42 of board 22 in a spaced-apart relationship from right to left. Each of the pin #s 7, 8, 9, and 10 is defined by a respective castellation 35 as described above.

GND (ground), antenna, and power detect pins #s 11, 12, and 13 respectively extend along the left side edge 48 of the printed circuit board 22 from top to bottom and in spaced-apart relationship as viewed from the perspective of FIGS. 5 and 9. As described above, pin #s 12 and 13 are defined by respective vias 38, while pin #11 is defined by a castellation 35. Pin #13 is located below the copper strip 47. Pin #s 12 and 13 are located above the copper strip 47.

Duplexer 34, which is preferably of a ceramic monoblock construction providing an insertion loss of about 1.3 dB on the receive side and 1.5 dB on the transmit side, is located and positioned on the top surface of the board 22 in a relationship generally adjacent and parallel to the left side edge 48 of board 22 and above and parallel to the copper strip 47. RF antenna pin #12 is located adjacent board edge 48 in a relationship and position generally opposite the duplexer 34.

Rx low noise amplifer 39 is located generally in the upper left hand corner of the board 22 to the left of, and spaced from, the Rx bandpass filter 40 and above and spaced from the duplexer 34 in a relationship adjacent to and spaced from the left side edge 48 of board 22. VLNA pin #9 and LNA gain select pin #10 are defined and located along the board edge 42 in a relationship and position generally above the Rx low noise amplifer 39. The Rx low noise amplifer 39 has a noise figure of 1.3 dB and a gain of 14 dB typical, or in bypass mode; 4.3 dB NF and −3 dB gain typical. Amplifier 39 is linear and designed to work within the distributed duplexer architecture.

By way of background, it is known that a local area Node B needs to have a receive sensitivity of at least −107 dBm (12.2 Kbps) in order to meet TS25.104 R6 standard. This equates to a system noise figure of around 19 dB (actual noise figure requirements will vary according to other system impairments). A local area Node B also needs to have a higher input linearity compared to a wide area Node B. In order to meet the TS25.104 R6 standard, a system IIP3 needs to be approximately −10 dBm (a few dBs margin is added for variation in the Rx chain). However, a system IIP3 closer to 0 dB is more likely to be a typical target as deployed environments for local area Node Bs can be very harsh from an interference perspective.

Referring back now to FIG. 5, low pass Rx filter 36 is located on the top surface of the board 22 generally between and below the Rx low noise amplifer 39 and above the duplexer 34, and slightly to the right of the right side edge of the amplifier 39, in a relationship spaced from and parallel to the amplifier 39 and duplexer 34 respectively. Ground pin #11 is defined in edge 48 generally opposite the filter 36. Filter 36 is adapted to reduce harmonic responses of the duplexer 34. This ensures that any spurious up to 12.75 GHz are attenuated to −30 dB or better.

The use of filters 25, 34, and 36 in combination define a distributed filtering configuration which provides the necessary "blocking" function. By way of background, it is known that one of the most challenging aspects of the UMTS standard, with respect to receiver design, is "blocking", i.e., preventing the Tx signal from interfering with the Rx signal. In a typical radio system design, the duplexer protects the radio from "blocking" by providing out-of-band attenuation of 30 dB or better with a minimum attenuation of 20 dB from 0 Hz to 1.9 GHz, and 2.0 GHz to 12.75 GHz. This, of course, is difficult for a 60 MHz wide filter having an insertion loss typically less than 1 dB. Most duplexers that can provide this performance have eight poles and can be as large as 11 inches by 9 inches by 3 inches (28 cm×23 cm×7.6 cm). Module 20, of course, is not large enough to accommodate such a large duplexer and thus "blocking" and the required close in rejection is accomplished through the use of the three distributed filters 25, 34 and 36 described above.

In the Tx path, coupler 30, isolator 28, Tx power amplifier 26, and Tx bandpass SAW filter 25 are all located and seated on the top surface of board 22 of module 20 in an area thereof below copper strip 47 which is not intended to be covered by the lid 45.

Isolator 28 and coupler 30 are located adjacent and spaced from the left side board edge 48, and generally in the lower left-hand corner of the board 22, in a relationship wherein the coupler 30 is located above the isolator 28 in spaced-apart and parallel relationship thereto. Power amplifier 26 is located between the coupler 30 and isolator 28 on one side and the right side board edge 46 on the other side. Tx bandpass SAW filter 25 is located between the power amplifier 26 and the right side board edge 46. Coupler 30 preferably has a coupling factor of 13.5 dB+/−0.3 dB. Isolator 28, which affords protection from variations in loading conditions or mismatching, preferably has about 15 dB of isolation. Power amplifier 26 preferably is a highly efficient GaAs HBT device with scalable power and capable of delivering the full TS25.104 local area requirements. Power amplifier 26 preferably dissipates about 6.4 W while delivering about 24 dBm at the antenna port. By changing amplifier bias and supply voltage, reduced output power can be achieved.

The via 38 defining power detect pin #13 is located adjacent the left side edge 48 of board 22 in an orientation generally opposite and to the left side of coupler 30, while ground pin #1 is located along the lower edge 44 of board 22 in an orientation generally to the right of and below the isolator 28. PA bias pin #3 and VPA pin #2 are also located along the lower edge 44 of board 22 in an orientation generally opposite and below the power amplifier 26.

Figures 6A, 6B:
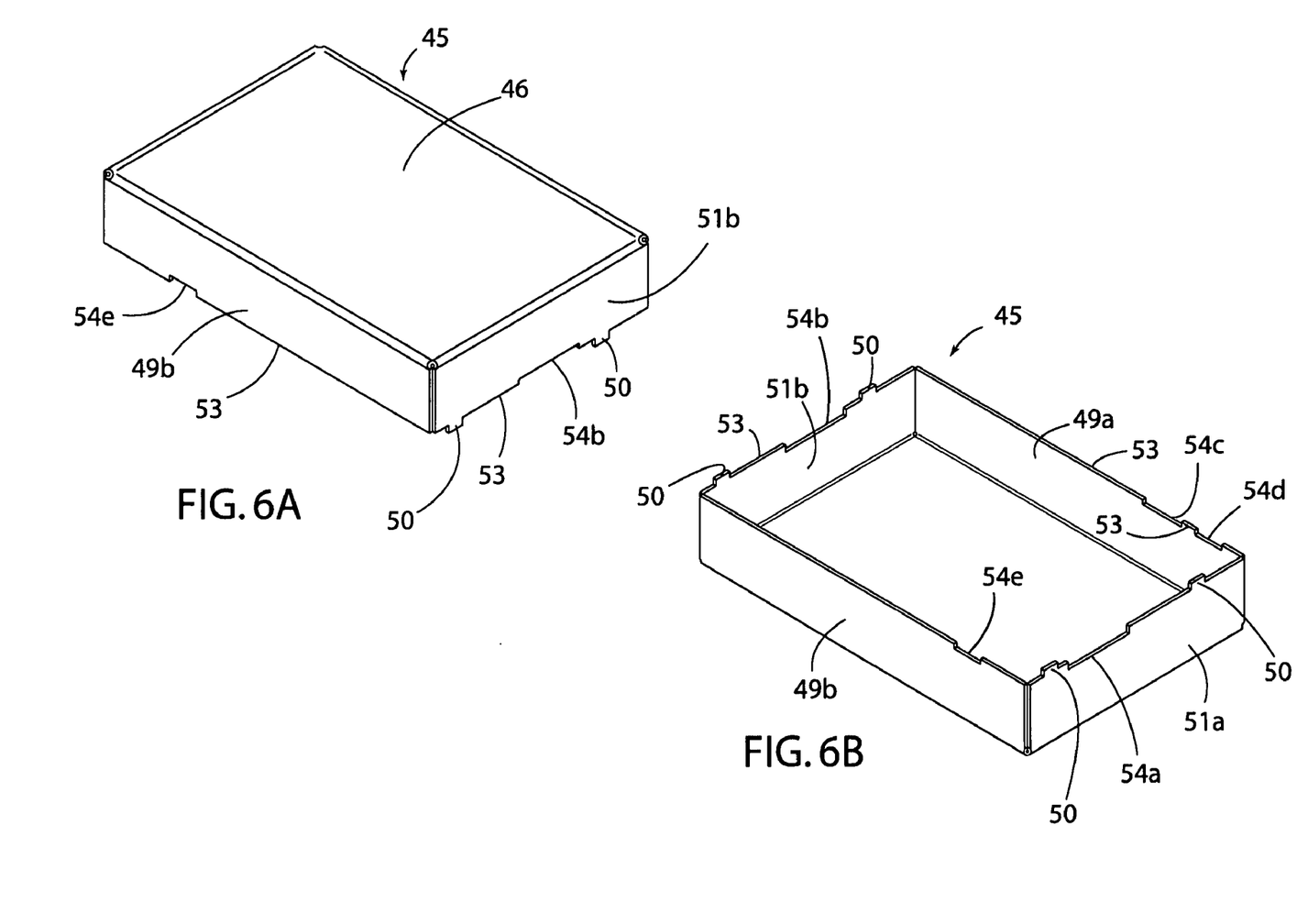
FIGS. 6A and 6B are perspective top and bottom views respectively of the lid of the front-end module of the present invention.

Referring now to FIGS. 6A and 6B, lid 45 includes a top wall or roof 46, a pair of upper and lower walls 49a and 49b, respectively, and a pair of sidewalls 51a and 51b, respectively, depending generally perpendicularly downwardly therefrom. The walls 49a, 49b, 51a and 51b in turn define lower longitudinal edges 53. The lower longitudinal edge 53 of each of the sidewalls 51a and 51b in turn defines at least two spaced-apart tabs 50 projecting downwardly therefrom and adapted to be fitted into the respective through-slots or castellations 37 for locating and securing the lid 45 to the board 22 in a grounded relationship with the board 22 wherein the lower longitudinal edge 53 of the respective lid walls 49a, 49b, 51a and 51b are seated over copper strip 47, the copper pads 35a of castellations 35, the copper pads 37a of castellations 37, and the copper strips 37c, 37e, 37f, 37h and 37g thus providing a grounded lid 45.

The lower longitudinal edges 53 of the respective walls additionally define a plurality of discrete notches 54. Specifically, notches 54a and 54b are defined in the respective sidewalls 51a and 51b between the tabs 50. Two additional notches 54c and 54d are defined in the top wall 49a adjacent the sidewall 51a, while one additional notch 54e is defined in the lower wall 49b.

Figure 8:
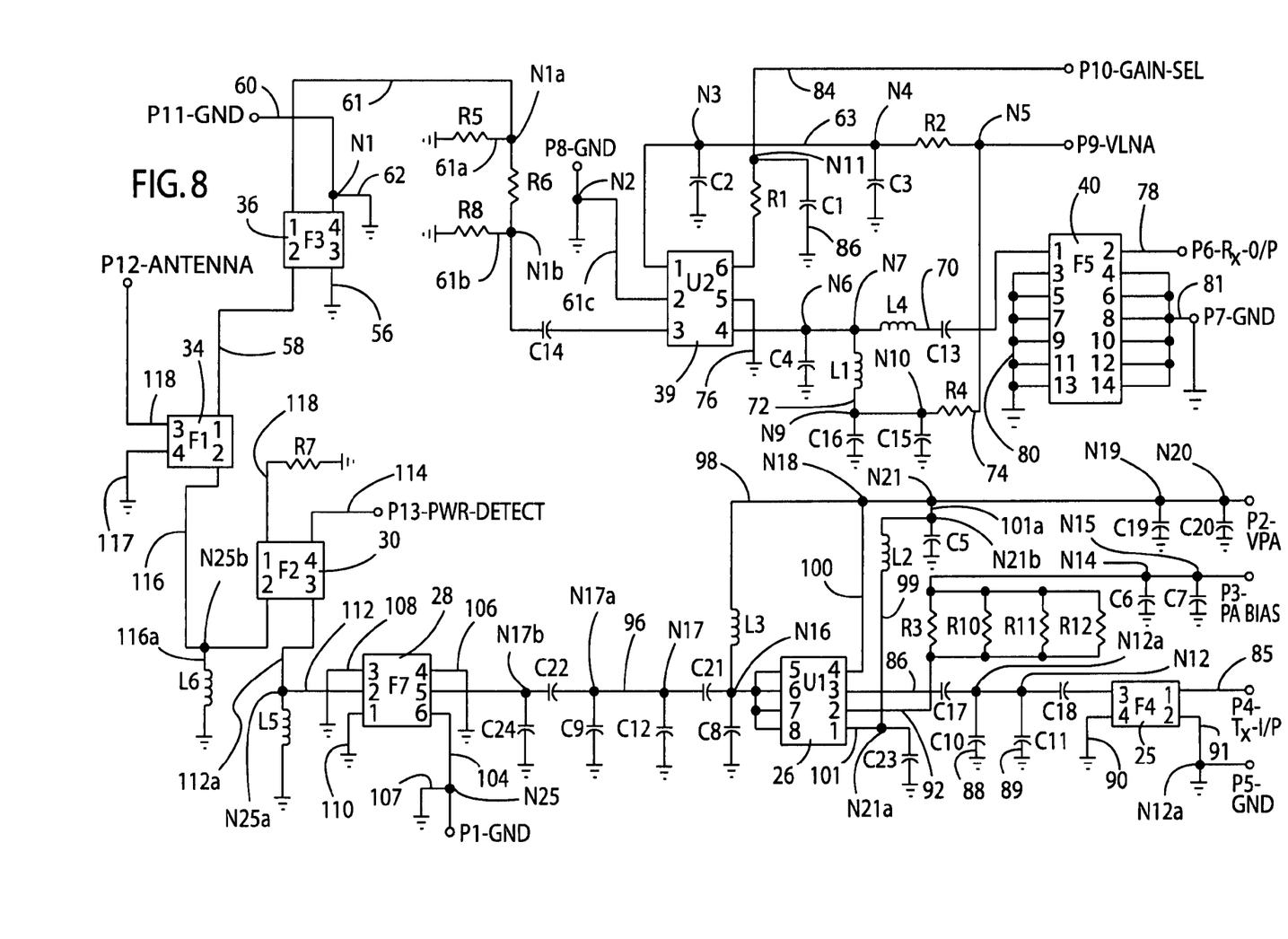
FIG. 8 is a schematic diagram of the electrical circuit of the front-end module of the present invention.

FIG. 8 is a schematic diagram of the electrical circuit of the front-end module 20 of the present invention. The reference and descriptions of each of the electrical components shown therein are identified in Table A below and shown in FIGS. 5 and 9:

TABLE A

| Reference | Description |
| --- | --- |
| C1 | Capacitor |
| C2 | Capacitor |
| C3 | Capacitor |
| C4 | Capacitor |
| C5 | Capacitor |
| C6 | Capacitor |
| C7 | Capacitor |
| C8 | Capacitor |
| C9 | Capacitor |
| C10 | Capacitor |
| C11 | Capacitor |
| C12 | Capacitor |
| C13 | Capacitor |
| C14 | Capacitor |
| C15 | Capacitor |
| C16 | Capacitor |
| C17 | Capacitor |
| C18 | Capacitor |
| C19 | Capacitor |
| C20 | Capacitor |
| C21 | Capacitor |
| C22 | Capacitor |
| L1 | Inductor |
| L2 | Inductor |
| L3 | Inductor |
| L4 | Inductor |
| L5 | Inductor |
| L7 | Inductor |
| R1 | Resistor |
| R2 | Resistor |
| R3 | Resistor |
| R4 | Resistor |
| R5 | Resistor |
| R6 | Resistor |
| R7 | Resistor |
| R8 | Resistor |
| R10 | Resistor |
| R11 | Resistor |
| R12 | Resistor |
| F1 | Duplexer |
| F2 | Coupler |
| F3 | Low pass filter |
| F4 | Tx bandpass filter |
| F5 | Rx bandpass filter |
| F7 | Isolator |
| U1 | Power amplifier |
| U2 | Low noise amplifier |

The circuit for the Rx (receive) path or portion of the module 20 will now be described with reference to FIG. 8.

Initially, and although not shown, it is understood that an Rx signal, received through the antenna and antenna pad of the motherboard of the picocell or microcell on which the module 20 is seated, is initially passed through the lower pad 38b of antenna pin #12 of module 20 up through the substrate 22 and then initially through circuit line 118 and into the input terminal #3 of duplexer 34 which is located on the top surface of the module 20. Input terminal #4 of duplexer 34 is connected to ground through a circuit line 117. The Rx signal is adapted to pass through the duplexer 34 (F1) and its output terminal #1 and then through circuit line 58 and into the input terminal #2 of Rx low pass filter 36 (F3). A second circuit line 56 at the input end or ground terminal #3 of Rx low pass filter 36 connects the filter 36 to ground.

Although not described in any detail, it is understood that the term "circuit line" and/or "ground" as used herein will, in certain instances, refer to an appropriate pad or the like circuit element on the surface of the board 22.

Rx low pass filter 36 includes two output circuit lines 60 and 61 extending from output terminals #4 and #1 thereof respectively. The output line 60 connects the output terminal #4 of filter 36 to ground pin #11. Circuit line 60 is also connected to ground via circuit line 62 which is connected to circuit line 60 at node N1. Node N1 is located on circuit line 60 between the output terminal #4 of Rx low pass filter 36 and ground pin #11. The output line 61 extends between the output terminal #1 of filter 36 and the input terminal #3 of amplifier 39 (U2).

From the output terminal #1 of filter 36, the Rx signal passes through circuit line 61 and through the resistors R5, R6, and R8 comprising the optional attenuator pad 37 defined in FIG. 1. R6 extends along circuit line 61. R5 extends between a node N1a and ground on a circuit line 61a located above resistor R6, while resistor R8 extends on a circuit line 61b extending between node N1b and ground below resistor R6.

A capacitor C14 is located on line 61 between R6 and input terminal #3 of low noise amplifier 39.

Low noise amplifier 39 has additional terminals #1, #2, #4, #5 and #6. Input terminal #2 of amplifier 39 is connected to ground pin #8 via node N2 on a circuit line 61c extending between input terminal #2 and ground pin #8. Input terminal #1 of amplifier 39 is connected to VLNA pin #9 via a circuit line 63. Capacitor C2 is connected between a node N3 on circuit line 63 and ground. Capacitor C3, which is connected in parallel with capacitor C2, extends between node N4 on circuit line 63 and ground. Capacitor C3 is located between capacitor C2 and VLNA pin #9. A resistor R2 is connected on circuit line 63 between node N4 and VLNA pin #9. Node N3 is located on circuit line 63 between the input terminal #1 of low noise amplifier 39 and node N4. Node N4 is located on circuit line 63 between node N3 and resistor R2. Resistor R2 is located on circuit line 63 between nodes N4 and a node N5. Node N5 is located on circuit line 63 between resistor R2 and VLNA pin #9.

Resistors R5, R6, and R8 are all located on board 22 above duplexer 34. L7, which forms part of the matching network for the low-noise amplifier 39, is located on board 22 above resistor R8. Resistors C2, C3, and C14 are all located on board 22 above R6 and to the left of amplifier 39. Resistor R2 is located on board 22 between the top substrate edge 42 and amplifier 39 and to the right of resistor C3 (FIG. 9).

Referring back to FIG. 8, terminal #4 (i.e., the Rx signal output terminal) of low noise amplifier 39 is connected to the input terminal #1 of Rx bandpass filter 40 via a circuit line 70. A capacitor C4 is connected between a node N6 on circuit line 70 and ground. An inductor L4 and capacitor C16 are connected in series between a node N7 on circuit line 70 and ground via a circuit line 72. An inductor L1 and capacitor C13 are connected in series on circuit line 70 between the node N7 and the input terminal #1 of Rx bandpass filter 40. Additionally, a resistor R4 is coupled between a node N9 on circuit line 72 and node N5 on circuit line 63 via a circuit line 74. Node N6 is located on circuit line 70 between the output terminal #4 of low noise amplifier 39 and node N7. Inductor L1 is located on circuit line 70 between nodes N6 and N7. Node N9 is located on circuit line 72 between inductor L4 and capacitor C16. Node N5 is located on circuit line 63 between resistor R2 and VLNA pin #9.

A capacitor C15 is connected between a node N10 on circuit line 74 and ground. Node N10 is located on circuit line 74 between node N9 and resistor R4.

Output terminal #5 of low noise amplifier 39 is connected to ground via a circuit line 76.

Output terminal #6 of low noise amplifier 39 is connected to gain select pin #10 via a circuit line 84. A resistor R1 is connected on circuit line 84 between the output terminal #6 of the low noise amplifier 39 and the gain select pin #10. A capacitor C1 is connected on a circuit line 86 between a node N11 on circuit line 84 and ground. Node N11 is located on the circuit line 86 between the resistor R1 and gain select pin #10.

As shown in FIG. 9, capacitor C1 and resistor R1 are located on board 22 between substrate edge 42 and amplifier 39. Resistor R4, capacitors C15 and C16, inductor L4, and capacitor C4, are all located on board 22 between the right edge of amplifier 39 and the left edge of duplexer 40. Inductor L1 and capacitor C13 are both located on the board 22 below the lower left edge corner of duplexer 40.

Referring back to FIG. 8, the input terminal #s 3, 5, 7, 9, 11, and 13 of filter 40 (F5) are all connected to ground via a common circuit line. The Rx signal passes through the output terminal #2 of Rx bandpass filter 40 into the Rx output pin #6 via a circuit line 78. The output terminal #s 4, 6, 8, 10, 12, and 14 of filter 40 are all connected to ground pin #7 via a common circuit line 81.

The RF transmit signal, on the other hand, is inputted at Tx I/P pin (transmit input) #4 and passes immediately through a circuit line 85 and into the input terminal #1 of Tx bandpass SAW filter 25 (F4). The output of Tx bandpass SAW filter 25 passes through output terminal #3 of filter 25 and then through a matching network of capacitors C10, C11, C17 and C18 and then into the input terminal #3 of power amplifier 26 (U1) via a circuit line 86 extending between the output terminal #3 of the Tx bandpass SAW filter 25 and the input terminal #3 of power amplifier 26. C18 is connected between the output terminal #3 of bandpass SAW filter 25 and a node N12 on circuit line 86. C17 is connected on circuit line 86 between a node N12a and input terminal #3 of Tx amplifier 26. Node N12 is located between node N12a and output terminal #3 of Tx bandpass SAW filter 25. Capacitor C10 is located on a circuit line 88 extending between node N12a on circuit line 86 and ground. Capacitor C11 is located on a circuit line 89 extending between node N12 on circuit line 86 and ground.

A circuit line 90 extends between a ground output terminal #4 of bandpass SAW filter 25 and ground. A circuit line 91 extends between input terminal #2 of filter 25 and ground. Ground pin #5 connects to circuit line 91 at node N12b.

Power amplifier 26 includes additional respective input and output terminals #1, #2, #4, #5, #6, #7 and #8. A circuit line 92 connects the input power amplifier 26 to VPA bias pin #3. Resistors R3, R10, R11, and R12 are all connected in parallel on circuit line 92 between input terminal #2 of power amplifier 26 and PA bias pin #3. Resistor R3 is connected on circuit line 92 between terminal #2 of Tx power amplifier 26 and PA bias pin #3. Capacitor C6 is connected between a node N14 on circuit line 92 and ground. A capacitor C7, in parallel with capacitor C6, is connected between a node N15 on circuit line 92 and ground. Nodes N14 and N15 are located on circuit line 92 between resistor series R3, R10, R11, and R12 and PA bias pin #3.

The RF output of the power amplifier 26 passes through terminals #5, #6, #7, and #8 thereof through another network of capacitors C8, C21, C12, C9, C22, and C24 along a circuit line 96 and into the input terminal #5 of Tx isolator 28. Circuit line 96 extends between output terminal #6 of power amplifier 26 and the input terminal #5 of isolator 28 (F7). Capacitor C21 extends on circuit line 96 between nodes N16 and N17 on circuit line 96. Capacitor C22 extends on circuit line 96 between node N17a and input terminal #5 of isolator 28. Capacitor C8 connects to circuit line 96 between node N16 and ground.

Capacitor C12, which is in parallel relationship with capacitor C8, connects to circuit line 96 between node N17 and ground. Node N17 is located on circuit line 96 between capacitors C21 and C22. Node N16 is located on circuit line 96 between capacitor C21 and output terminal #6 of power amplifier 26. Capacitor C9, which is in parallel relationship with capacitor C12, connects to circuit line 96 at node N17a which is between node N17 and input terminal #5 of isolator 28. Capacitor C24, which is in parallel relationship with capacitor C9, connects to circuit line 96 at node N17b which is located between node N17a and input terminal #5 of Tx isolator 28.

A circuit line 98 extends between the node N16 on circuit line 96 and VPA pin #2. A circuit line 100 extends between input terminal #4 of power amplifier 26 and node N18 on circuit line 98. A circuit line 101 extends between the input terminal #1 of power amplifier 26 and ground. A capacitor C23 is located on circuit line 101 between the input terminal #1 and ground.

A capacitor C20 on circuit line 98 extends between a node N20 on circuit line 98 and ground. A capacitor C19, which is in a parallel relationship with capacitor C20, is connected to circuit line 98 between a node N19 and ground. Nodes N19 and N20 are located on circuit line 98 between node N18 and VPA pin #2. A capacitor C5 is located on a circuit line 101a extending between a node N21 on circuit line 98 and ground. An inductor L2 extends on a circuit line 99 extending between a node N21a on circuit line 101 and a node N21b on circuit line 101a. Node N21b is located between capacitor C5 and node N21. Node N19 is located on circuit line 98 between nodes N18 and N20. Node N18 on circuit line 98 is located between node N16 and node N21.

Tx isolator 28 (F7) includes respective input and output terminal #s 1 through 6. Input terminal #6 on the input side of the Tx isolator 28 is connected to ground pin #1 via a circuit line 104. A circuit line 106 extends between input terminal #4 of Tx isolator 28 and ground. A circuit line 107 extends between a node N25 on circuit line 104 and ground. Terminal #3 on the output side of isolator 28 is connected to ground via a circuit line 108. Ground terminal #1, also on the output side of isolator 28, is connected to ground via a circuit line 110. The RF signal output of the isolator 28 passes through the output terminal #2 thereof and then into a circuit line 112 extending into a node N25a on a circuit line 112a which extends into the input terminal #3 of Tx coupler 30 (F2).

An inductor L5 extends on circuit line 112a between a node N25a and ground. Node N25a is located on circuit line 112a between inductor L5 and input terminal #3 of coupler 30.

A portion of the signal passing through Tx coupler 30 is diverted and outputted through output terminal #4 of Tx coupler 30 and then into power detect pin #13 via a circuit line 114 extending between the output terminal #4 of Tx coupler 30 and power detect pin #13. A circuit line 118 extends between the output terminal #1 of the Tx coupler 30 and ground. A resistor R7 is connected along circuit line 118 between the output terminal #1 of Tx coupler 30 and ground.

The RF output of Tx coupler 30 passes through coupler output terminal #2 and into the input terminal #2 of duplexer 34 via a circuit line 116 extending therebetween. An inductor L6 extends on a circuit line 116a between a node N25b on circuit line 116 and ground.

As shown in FIG. 9, resistors R11, R10, R12, R3; capacitors C7, C6, C2; inductor L2; and capacitors C5 and C20 are all located on the uncovered portion of board 22 below copper strip 47 and all extend in a generally co-linear relationship along the lower board edge 44 from the right side board edge 46. More specifically, said components are located generally between the lower board edge 44 on one side and the Tx bandpass filter 25 and amplifier 26 on the other side. Capacitors C10, C11, C17, and C18 are also all located on the uncovered portion of board 22 below copper strip 47. Specifically, said components are located on the board 22 in the space between amplifier 26 and Tx bandpass filter 25.

Capacitors C8, C9, C12, C22, C19, and C24; and inductor L3 are also located on an uncovered portion of the board 22 and, more specifically, the space therein between the isolator 28 on one side and the amplifier 26 on the other side.

RF inductors L5 and L6 and resistor R7 are still further also all located on the uncovered portion of board 22. More specifically, inductor L5 is located in the space between the left side board edge 48 and isolator 28; resistor R7 is seated to the right of coupler 30; and L6 is seated to the right of resistor R7.

FIG. 9 additionally depicts the various component connection pads, pins, and printed circuit lines which are all composed of strips and/or regions of copper or the like conductive material which has been appropriately defined and deposited on the top and bottom surfaces 23 and 27 of the printed circuit substrate board 22 as is known in the art.

Although not described herein in any detail, it is understood that the various copper regions and strips identified and described above have been defined and formed thereof as a result of either the subtraction or removal of selected portions of the copper material from the upper and lower surfaces 23 and 27 respectively of the substrate 22 during the substrate manufacturing process and/or as a result of the application of layers or strips of solder mask material over pre-selected portions of the copper layer as is also known in the art.

As shown in FIG. 9, it is understood that selected regions on the board 22 outside of the bounded dashed areas comprise regions of substrate dielectric material; that other selected regions on the board 22 bounded by the dashed lines shown therein comprise regions of the board wherein the copper material has been covered with solder mask material; and further that still other selected ones of the regions bounded by solid lines in FIG. 9 comprise regions of exposed copper material.

Selected ones of the copper connection pads, strips and regions are used to direct solder attach the terminals of the various electronic components of the module 20 of the present invention directly to the top surface 23 of the board 22 and also to direct solder attach the various terminals and pads on the lower surface 27 of the board 22 to the terminals and pads on the top surface of the motherboard of a picocell or microcell. Stated another way, selected ones of the exposed copper pads, strips and regions is adapted to have solder applied thereto as is also known in the art.

More particularly, and referring to FIG. 9, printed circuit board 22 has a plurality of differently sized and shaped connection copper pads 130 located below the Rx bandpass filter 40, Tx bandpass filter 25, low noise amplifier 39, low pass filter 36, duplexer 34, Tx coupler 30, isolator 28 and power amplifier 26 so as to allow the same to be direct surface solder mounted to the board 22. Differently sized and shaped copper connection pads 132 are also appropriately positioned below each of the resistors, capacitors and inductors comprising the circuit of module 20.

Board 22 additionally defines a first plurality of ground through-holes 134 which, as known in the art, extend between the top and bottom surfaces 23 and 27 respectively of the board 22 and are adapted to make a grounding electrical connection between the top and bottom surfaces and any intermediate metallized layers comprising the board 22. The interior surface of each of the through-holes or vias 134 is coated with a layer of copper or the like conductive material by electroplating or the like process as known in the art. The through-holes 134 are dispersed throughout the surface of the substrate 22.

As also shown in FIG. 9, a second plurality of through-holes or vias 136 are defined and formed on the board 22 beneath the region where the power amplifier 26 is seated on the board 22 so as to define a heat sink for the heat created by power amplifier 26. Through-holes 134 are double-plated with copper or the like material for added thermal conductivity and likewise extend through the board 22.

Referring back to FIG. 7, it is understood that the lower surface 27 of substrate 22 additionally defines a plurality of generally rectangularly-shaped copper pads 138. The copper pads 138 are separated by strips 140 of solder mask material.

Board 22 still further defines at least one aperture 150 defining a through-way for a screw or the like (not shown) adapted to allow the module 20 to be secured to the heat sink and a customer's motherboard to allow better thermal contact between the motherboard and module 20. In the embodiment of FIG. 9, aperture 150 is located below copper strip 47 and to the left of power amplifier 26.

The process for assembling a module 20 involves the following steps. After the substrate/board 22 has been fabricated, i.e., once all of the appropriate copper castellations, copper strips, copper vias, copper pads, and copper through-holes have been formed thereon, and as described above, Ag/Sn (silver/tin) solder is screen printed onto a 2.6" by 4.6" printed circuit board array and, more particularly, onto the surface of each of the appropriate solder pads and strips defined on the array following the application of predetermined layers and strips of solder mask material as known in the art. Solder is applied to the surface of all of the designated copper strips, pads and regions and all of the electrical components including all of the filters defining the module 20 are then appropriately placed and located on the array.

The lid 45 is then placed over the appropriate portion of the board 22 as described above into a soldered coupled relationship wherein the tabs 50 thereof are fitted into the appropriate castellations/slots 37 defined in the respective side edges 46 and 48 of board 22 thereby appropriately locating and securing the lid 45 to the board 22 in a relationship where the lower edge of the lower wall 49b of lid 45 is seated over the copper strip defining line 47, the lower edge of the upper wall 49a extends along and adjacent to top board edge 42 and over the respective copper strips and pads 35a, 37c, 37g, and 37h as described above defined thereon, and the lower edges of the respective sidewalls 51a and 51b of lid 45 are seated over the respective copper strips and pads 35a, 37a, 37c and 37e extending along respective opposed board edges 46 and 48. This placement of the lid 45 into contact with pre-selected areas of the copper strips and pads on the substrate/board 22, of course, defines a module 20 where the lid 45 is electrically grounded.

It is further understood that the notches 54 defined in the lower peripheral edge of the walls 49 and 51 of lid 45 are adapted to provide a continuous grounding surface around the lid 45, while at the same time providing a gap between the lid 45 and those selected portions of the board 22 comprising exposed dielectric material or solder mask material such as, for example, the notches 54a and 54b overlying the respective vias 38 defining the antenna pin #12 (FIG. 4) and the Rx output pin #6 (FIG. 2), the notches 54c and 54d overlying the regions surrounding pins #8 and #9 (FIG. 3), and the notch 54e which overlies selected circuit lines (FIG. 2), i.e., regions not intended to be grounded. The module 20 is then reflow soldered at a maximum temperature of 260° C. so as to couple all of the components and lid 45 to the board.

Moreover, and although not shown in any of the FIGURES or described herein in great detail, it is understood that a block of RF signal-absorbing foam material of the type sold by R & F Products of San Marcos, Calif. and measuring about 0.43"L×0.20 W×0.13"H could be seated and suitably secured to the top surface 23 of the board 22 in the open area 160 thereof (FIG. 7) bounded by duplexer 34, Rx bandpass filter 40, Tx bandpass filter 25, and copper strip 47 for absorbing predetermined levels of the Rx or Tx frequencies passing through the respective transmit and receive sections of the module 20, thus minimizing what is known in the art as "cross-talk".

Finally, the array is then diced up as is known in the art and the individual modules 20 are then final tested and subsequently "taped and reeled" and readied for shipment.

While the invention has been taught with specific reference to an embodiment of the module adapted for use on the front end of a picocell, it is understood that someone skilled in the art will recognize that changes can be made in form and detail without departing from the spirit and the scope of the invention as defined in the appended claims. The described embodiment is to be considered in all respects only as illustrative and not restrictive.

What is claimed is:

1. An RF module adapted to transmit and receive RF signals and adapted for mounting to a front end of a base station and comprising:
a signal transmit section on a top surface of a substrate including a transmit bandpass filter, a power amplifier, and a discrete ceramic duplexer; and
a signal receive section on said top surface of said substrate comprising said discrete ceramic duplexer, a low-noise amplifier, and a discrete ceramic receive bandpass filter; and a lid on the top surface of said substrate covering the discrete ceramic duplexer, the low-noise amplifier, and the discrete ceramic receive bandpass filter in the signal receive section but not covering at least the power amplifier for reducing the transfer of heat from the power amplifier in the signal transmit section to the discrete ceramic duplexer, the low-noise amplifier and the discrete ceramic receive bandpass filter.

2. The RF module of claim 1, wherein the RF signals are adapted to pass successively through said transmit bandpass filter, said power amplifier, and said discrete ceramic duplexer defining said signal transmit section.

3. The RF module of claim 2 further comprising an isolator on the substrate and the RF signals are adapted to pass successively through said transmit bandpass filter, said power amplifier, said isolator, and said discrete ceramic duplexer.

4. The RF module of claim 3 further comprising a coupler on the substrate and the RF signals are adapted to pass successively through said transmit bandpass filter, said power amplifier, said isolator, said coupler, and said discrete ceramic duplexer.

5. The RF module of claim 1, wherein the RF signals are adapted to pass successively through said discrete ceramic duplexer, said low-noise amplifier, and said discrete ceramic receive bandpass filter defining said signal receive section.

6. The RF module of claim 5 further comprising a receive low pass filter on the substrate and the RF signals are adapted to pass successively through said discrete ceramic duplexer, said receive low pass filter, said low-noise amplifier, and said discrete receive bandpass filter.

7. The RF module of claim 1 further comprising an aperture in said substrate defining a through-way for a screw for securing said RF module to a motherboard.

8. The RF module of claim 1, wherein said substrate includes a peripheral edge and top and bottom surfaces, the substrate further including at least first, second, and third vias extending between the top and bottom surfaces, each of the first, second, and third vias being spaced from the peripheral edge and defining respective first, second, and third RF signal input/output pins.

9. The RF module of claim 1, wherein said substrate defines a plurality of through-holes located below said power amplifier.

* * * * *

UNITED STATES PATENT AND TRADEMARK OFFICE
CERTIFICATE OF CORRECTION

| | | |
|---|---|---|
| PATENT NO. | : 7,983,624 B2 | Page 1 of 1 |
| APPLICATION NO. | : 11/452800 | |
| DATED | : July 19, 2011 | |
| INVENTOR(S) | : Thomas A. Knecht et al. | |

It is certified that error appears in the above-identified patent and that said Letters Patent is hereby corrected as shown below:

Column 12, line 55, "input power amplifier" should be changed to --input terminal #2 of Tx power amplifier--

Signed and Sealed this
Twentieth Day of March, 2012

David J. Kappos
*Director of the United States Patent and Trademark Office*